(12) United States Patent
Naitoh

(10) Patent No.: US 7,368,805 B2
(45) Date of Patent: May 6, 2008

(54) SEMICONDUCTOR DEVICE, FLEXIBLE SUBSTRATE, TAPE CARRIER, AND ELECTRONIC DEVICE INCLUDING THE SEMICONDUCTOR DEVICE

(75) Inventor: Katsuyuki Naitoh, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 137 days.

(21) Appl. No.: 11/229,786

(22) Filed: Sep. 20, 2005

(65) Prior Publication Data

US 2006/0060949 A1 Mar. 23, 2006

(30) Foreign Application Priority Data

Sep. 22, 2004 (JP) ............................ 2004-275637

(51) Int. Cl.
*H01L 23/48* (2006.01)
(52) U.S. Cl. .................. 257/668; 257/676; 257/693; 257/762; 257/E23.065; 257/E23.177
(58) Field of Classification Search ................ 257/668, 257/688, E23.065, E23.177
See application file for complete search history.

(56) References Cited

U.S. PATENT DOCUMENTS 5,680,191 A * 10/1997 Voisin et al. ............... 349/150

2001/0009299 A1 7/2001 Saito
2002/0109814 A1 8/2002 Murahashi et al.

FOREIGN PATENT DOCUMENTS

JP 1-236637 9/1989

OTHER PUBLICATIONS

"Industry-leading fine pitch mount technology Sharp establishes high density multichip/system on film (SOF) mass production technology Multiple LSI chips mounted on single flexible board, allowing system integration Thickness reduced by more than half" by Sharp Kabushiki Kaisha, "News Release from Sharp Kabushiki Kaisha No. 2001-103", Published Dec. 11, 2001.

* cited by examiner

*Primary Examiner*—Minhloan Tran
*Assistant Examiner*—Krista Soderholm
(74) *Attorney, Agent, or Firm*—Harness, Dickey & Pierce, PLC

(57) ABSTRACT

In the semiconductor device of the present invention, there are provided output terminals on two sides perpendicular to one of four sides which is nearest output outer leads of a liquid crystal driver chip mounted to a flexible substrate. The wires extending from the inner leads connected to the output terminals to the output outer leads do not need to travel around a liquid crystal driver chip. The flexible substrate can be scaled down. Yields can be increased.

7 Claims, 5 Drawing Sheets

SEMICONDUCTOR DEVICE, FLEXIBLE SUBSTRATE, TAPE CARRIER, AND ELECTRONIC DEVICE INCLUDING THE SEMICONDUCTOR DEVICE

This Nonprovisional application claims priority under 35 U.S.C. § 119(a) on Patent Application No. 2004-275637 filed in Japan on 22 Sep. 2004, the entire contents of which are hereby incorporated by reference.

FIELD OF THE INVENTION

The present invention relates to COF (chip on film) semiconductor devices, in which a semiconductor chip is packaged on a flexible substrate. The invention also relates to associated flexible substrates, tape carriers, and electronic devices containing such semiconductor devices.

BACKGROUND OF THE INVENTION

Recent years have seen CRTs being replaced by display panels contained in display panel modules (electronic devices). The latter are typically liquid crystal panels because of their numerous advantages, such as low power consumption and compactness.

However, a liquid crystal panel still costs 10 times a CRT. To create a greater market for the liquid crystal panel, it is essential to cut costs for the liquid crystal panel and its peripherals.

The conventional liquid crystal driver chip (semiconductor chip) driving a liquid crystal panel is packaged on a flexible substrate which is an insulating base member provided with a wiring layer thereon. The package chip, or semiconductor device, is connected to an edge of a liquid crystal panel.

Packaging methods for the semiconductor device, by which the semiconductor chip is packaged on the flexible substrate, include COF (chip on FPC (flexible print circuit)) and TCP (tape carrier package).

In a TCP, the base member of the flexible substrate has holes (device holes) for mounting a semiconductor chip. The semiconductor chip is connected at contact terminals on its electrodes to inner leads/wires which stick out from the device holes. In contrast, for COF, the flexible substrate has no device holes. The inner leads, connected to a semiconductor chip, are formed on the base member.

Today's focus is on COF methods because it is easy to reduce the width of the semiconductor device. Narrow-width devices well meet demands for reductions in the frame size of display panel modules in which the semiconductor device is disposed in the frame.

The inner leads stand on the base member in COF, whereas in TCP, the inner leads stick out from the device holes for connection to the semiconductor chip. COF therefore more readily accommodate reductions in the width of the semiconductor device than TCP.

FIG. 4 illustrates an exemplary liquid crystal panel module in which a semiconductor device is packaged. In the figure, 41 indicates the liquid crystal panel. Along an edge of the liquid crystal panel 41 are provided COF semiconductor devices 44 in which the chip is packaged by a COF method. The devices 44 are connected to the panel 41 via anisotropic conducting film, or ACF, for example. Each semiconductor device 44 contains a flexible substrate and a liquid crystal driver chip (semiconductor chip) 45 mounted on the substrate.

The flexible substrate of the semiconductor device 44 has external contact terminals formed thereon: i.e., output outer leads 42 and input outer leads 43. The semiconductor device 44 is connected to the liquid crystal panel 41 through the output outer leads 42 and to a circuit board 46 through the input outer leads 43. The semiconductor device 44, connected to the liquid crystal panel 41, exchanges signals and turns power on/off through the circuit board 46.

The liquid crystal driver chip 45 feeds analog signals to the liquid crystal panel 41 through the flexible substrate in the semiconductor device 44. The analog signals travel from the liquid crystal driver chip 45 via the flexible substrate to the liquid crystal panel 41. On the liquid crystal panel 41, those contact terminals for connection to the flexible substrate usually align parallel to an edge of the liquid crystal panel 41. Therefore, the output outer leads 42 of the flexible substrate, to which the contact terminals of the liquid crystal panel 41 are connected, are similarly arranged.

From these design points of view, the semiconductor device can be best reduced in width by: aligning the output terminals of the liquid crystal driver chip 45 along a long side of the liquid crystal driver chip 45 so that the terminals are parallel to the length of the liquid crystal driver chip 45 and straightening the wires between the output terminals of the liquid crystal driver chip 45 and the flexible substrate of the output outer leads 42 to the extent possible. The same modifications are required with the input terminals of the liquid crystal driver chip 45 to render the semiconductor device narrow and long. The input terminals are in many cases also arranged along a long side of the liquid crystal driver chip 45.

As a result, the conventional liquid crystal driver chip 45 naturally has a very high external aspect ratio with the short sides extremely shorter than the long sides.

There is another demand to reduce the size of the liquid crystal driver chip 45 as much as possible. The objective of doing so is to reduce the cost of the semiconductor device.

Apart from these demands for narrower, longer semiconductor devices and smaller liquid crystal driver chips, a notable trend is happening recently. Traditional line-reversal drive schemes for liquid crystal in a liquid crystal panel module are mostly replaced by dot-reversal drive schemes. Liquid crystal driver chips which drive source signal lines are designed for dot-reversal schemes.

A liquid crystal driver chip 45 for source signal lines needs nine grayscale power supply terminals to achieve a 64 grayscale level display, for example. The dot-reversal scheme would need double that number, that is, 18 grayscale power supply terminals, because the scheme utilizes both positive and negative reference grayscale levels.

Another technology trend as noteworthy as the dot-reversal scheme is RSDS (reduced swing differential signaling) for liquid crystal driver chips. RSDS retains low noise levels for digital signals in the liquid crystal driver chip 45 until analog signals are output to the liquid crystal panel 41. RSDS is based on differentials on two signal lines and needs double the number of signal lines for traditional single signal wiring.

With these mainstream dot-reversal driving and RSDS technologies, the liquid crystal driver chip 45 now has 40 or more input signal lines. As for the output signal lines, the liquid crystal driver chip 45 has 1024×3 (R, G, B)=3072 of them for an XGA (1024×768) liquid crystal panel 41, for example. To drive the panel with eight liquid crystal driver chips, each liquid crystal driver chip 15 drives 384 source signal lines. Each liquid crystal driver chip for source signal lines has 384 output signal lines.

Now, let us consider how long the liquid crystal driver chip 45 should be on its long sides, one for output and the other for input. If 384 outputs are needed with 50-μm pitches, for example, the long side for output where output terminals will be formed needs be at least 384×0.05=19.2 mm long. On the other hand, if 45 inputs are needed with 75-μm pitches, the long side for input where input terminals will be formed needs be no longer than 3.375 mm, less than one-fifth for the long-side for output.

Ideally, the output and input terminals should be separated: the output terminals should be on the long side for output opposite the output outer leads connected to the liquid crystal panel 41, and the input terminals on the long side for input opposite the input outer leads connected to the circuit board 46. This design however would allow the output terminals, which outnumber the input terminals by far, to place constraints on the long sides of the liquid crystal driver chip 54, which in turn would restrict the downscaling of the chip for lower cost.

In view of these circumstances, News Release, No. 2001-103 (made public on Dec. 11, 2001) by Sharp Co., Ltd. among other publications suggests to place some of the output terminals along the long side for input of the liquid crystal driver chip to provide the long side for output and the long side for input with an equal number of electrodes, thereby minimizing the length of the long side of the liquid crystal driver chip.

FIG. 5 illustrates the COF semiconductor device described in News Release, No. 2001-103 in which some of the output terminals are placed along the long side for input where the input terminals of the liquid crystal driver chip are arranged. FIG. 5 is presented as a plan view so as to clearly show differences between the device and the present invention. In the figure, the semiconductor device 61, along with others (not shown), is yet to be individually punched off the long and narrow tape carrier 50. They are still lined end to end on the tape carrier 50. The liquid crystal driver chip 54 and the solder resist 53 giving protection to wires 52 on the flexible substrate 51 are depicted as being transparent so as to visualize how the wires 52 are routed.

Referring to FIG. 5, in the semiconductor device 61, the liquid crystal driver chip 54 sitting on the flexible substrate 51 has some of its output terminals formed, as indicated by Xs, on the long side for input which is opposite the side where input outer leads 57 are provided. Those of the wires 52 on the flexible substrate 51 which are connected to the liquid crystal driver chip 54 at the output terminals on the long side for input (indicated by 52c) are routed to turn 180° from the inner leads 55 toward the output outer leads 56.

Those of the wires 52 on the flexible substrate 51 other than the ones indicated by 52c are formed linearly. Specifically, those indicated by 52a which are connected to the input terminals on the long side for input of the liquid crystal driver chip 54 are formed to run linearly to the input outer leads 57. In addition, those indicated by 52b which are connected to the output terminals on the long side for output of the liquid crystal driver chip 54 opposite the side where the output outer leads 56 are provided are formed to run linearly to the output outer leads 56.

As mentioned earlier, ideally, wires on the flexible substrate connected to the liquid crystal driver chip should run linearly to the input outer leads if they are intended to be coupled to the input terminals and linearly to the output outer leads if they are intended to be coupled to the output terminals.

However, as shown in FIG. 5, in this conventional design of the liquid crystal driver chip 54 in which the input terminals and the output terminals X are both placed on the same long side of the liquid crystal driver chip 54 for the purpose of size reduction, the wires 52c connected to the output terminals X on the long side for input travel around the liquid crystal driver chip 54 by making a 180° turn before ultimately reaching the output outer leads 56.

The wire extending from the output terminal X which is nearest the corner of the liquid crystal driver chip 54 takes the shortest path because it has to skirt only the liquid crystal driver chip 54. Meanwhile, the wire extending from an adjacent terminal X has to skirt not only the liquid crystal driver chip 54, but the wire connected to the output terminal X nearest the corner. Further, the wire extending from a next output terminal X has to skirt these two wires too. The more the output terminals X formed on the input side, the more wires each wire has to travel around in addition to the liquid crystal driver chip 54, and the longer path it has to take.

These paths in the conventional design require increasingly more space to accommodate the wires 52c on the flexible substrate 51, adding to the size of the flexible substrate 51. The increased size of the flexible substrate 51 would be an obstacle in the efficient use of the tape carrier. This could kill off the cost savings on the semiconductor device achieved by the downscaling of the semiconductor chip (liquid crystal driver chip).

Further, the design involves many curves to make the 180° turn. Curves are not desirable for etching which is a method typically used for patterning on the flexible substrate 51, because etching often cannot sufficiently remove materials from curves. Resultant reduced yields might also lower the cost saving benefits.

SUMMARY OF THE INVENTION

The present invention has an objective to provide a semiconductor device on a scaled-down flexible substrate with a high yield for effective utilization of tape carrier. It is also an objective to provide an associated flexible substrate, tape carrier, and electronic device containing such a semiconductor device.

The semiconductor device of the present invention, to achieve the objectives, is arranged as follows. The device includes: at least one semiconductor chip; and a flexible substrate on which the semiconductor chip is packaged. The substrate has input contact terminals and output contact terminals for external connection on two opposing sides and contact electrodes for electrical connection to the semiconductor chip. The semiconductor chip has output terminals on two sides perpendicular to one of four sides which is nearest the output contact terminals of the flexible substrate. The flexible substrate has wires extending thereon from the contact electrodes connected to the output terminals on the two sides to the output contact terminals.

The electronic device of the present invention contains the above semiconductor device of the present invention.

According to the arrangement of the semiconductor device, the semiconductor chip has output terminals on the two sides perpendicular to the side nearest the output contact terminals. The wires extending from the contact electrodes connected to the output terminals on the flexible substrate to the output contact terminals do not have to skirt the semiconductor chip. The wires only have to run around those extending from the contact electrodes which are nearer to the output contact terminals.

The absence of wires skirting the semiconductor chip allows for shorter wire lengths and eliminates the need to secure space for the wires on the flexible substrate. This enables downscaling of the flexible substrate and efficient use of the tape carrier. Besides, the wires travel to the output contact terminals without making a sharper turn than about 90°. The wires thus have fewer curves where etching defects are likely, contributing to higher yield ratios.

For these reasons, the semiconductor device is less expensive. So is the electronic device containing the semiconductor device.

The flexible substrate of the present invention, to achieve the objectives, is arranged as follows. The substrate has at least one semiconductor chip packaged thereon and includes: input contact terminals and output contact terminals for external connection on two opposing sides; contact electrodes for electrical connection to the semiconductor chip, the electrodes being arranged in a manner corresponding to four sides of the semiconductor chip; and wires extending from those of the contact electrodes which are provided on two sides perpendicular to one of four sides nearest the output contact terminals, the wires being connected to the output contact terminals.

As explained in relation to the semiconductor device, mounting a semiconductor chip on a flexible substrate arranged as above enables downscaling of the flexible substrate and efficient use of the tape carrier, contributing to high yields.

The tape carrier package of the present invention, to achieve the objectives, is arranged as follows. The tape carrier includes a long and narrow base member and a row of sprockets on sides thereof along a length of the base member. The tape carrier is divided along external shape of each semiconductor device so as to form input contact terminals and output contact terminals for external connection on two opposing sides and to provide multiple flexible substrates having contact electrodes for electrical connection to a semiconductor chip. The contact electrodes are arranged in a manner corresponding to four sides of the semiconductor chip. The wires extending from the contact electrodes provided on two sides perpendicular to one of the four sides nearest the output contact terminals are connected to the output contact terminals.

As explained in relation to the semiconductor device, mounting a semiconductor chip on a flexible substrate obtained from a tape carrier arranged as above enables downscaling of the flexible substrate and efficient use of the tape carrier, contributing to high yields.

Additional objects, advantages and novel features of the invention will be set forth in part in the description which follows, and in part will become apparent to those skilled in the art upon examination of the following or may be learned by practice of the invention.

DESCRIPTION OF THE EMBODIMENTS

Figure 1:
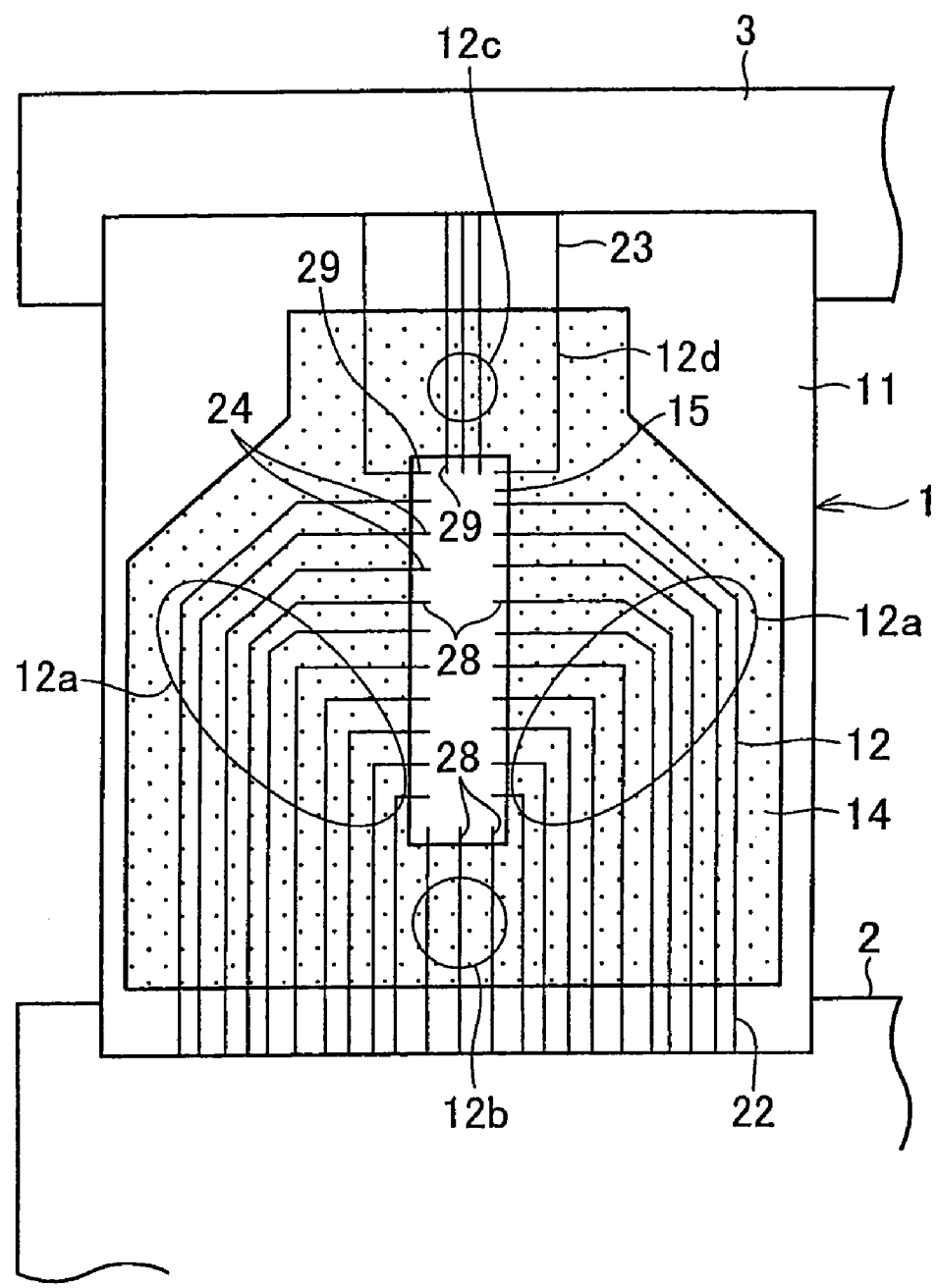
FIG. 1, showing an embodiment of the present invention, is a plan view illustrating an arrangement of a major part of a liquid crystal panel module containing a semiconductor device.
Figure 2:
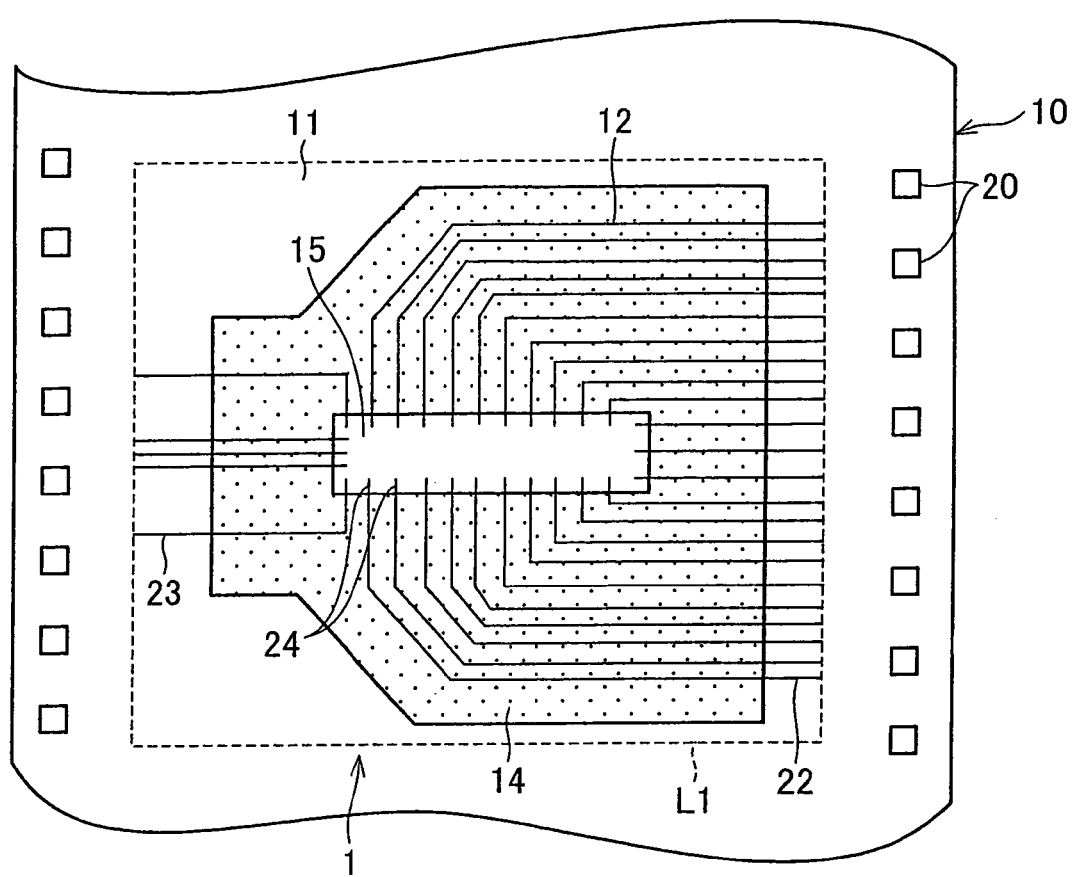
FIG. 2 is a plan view illustrating the semiconductor device in FIG. 1 sitting on a tape carrier before being individually punched off.
Figure 6:
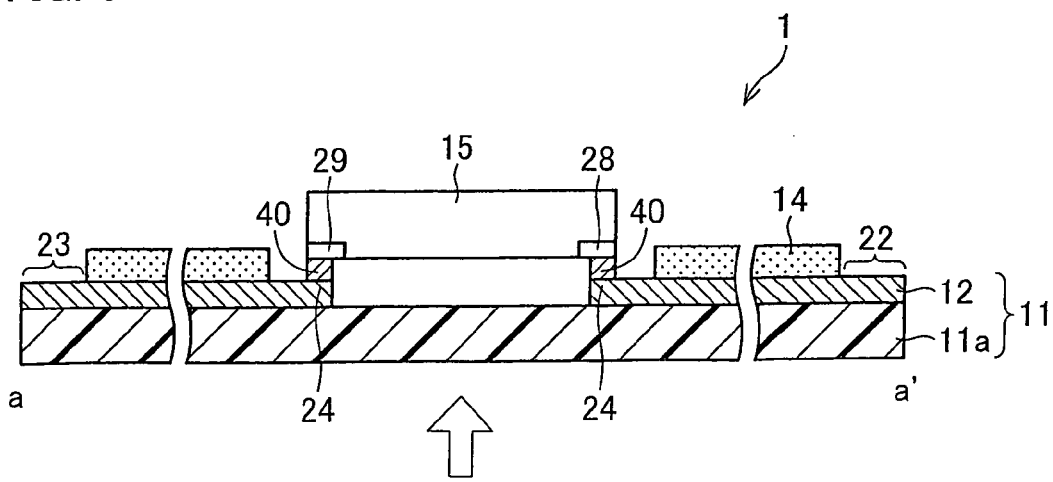
FIG. 6 is a cross-sectional view illustrating the semiconductor device in FIG. 1.

The following will describe an embodiment of in accordance with the present invention in reference to FIGS. 1, 2, and 6.

FIG. 1 is a plan view illustrating a major connection part of a liquid crystal panel module (electronic device) in which is packaged a COF semiconductor device 1 which is an embodiment in accordance with the present invention. The liquid crystal panel module is an example of the electronic device. The semiconductor device of the present invention is applicable also to various electronic devices containing a COF semiconductor device.

In FIG. 1, 2 is a liquid crystal panel. The semiconductor device 1 is connected to an edge of the liquid crystal panel 2 via anisotropic conducting film, or ACF, for example. FIG. 1 shows only one semiconductor device 1 being connected to an edge of the liquid crystal panel 2. Actually, a plurality of semiconductor devices 1 are connected to the edge of the liquid crystal panel 2.

The semiconductor device 1 has output outer leads (output contact terminals) 22 and input outer leads (input contact terminals) 23 as external contact terminals. The semiconductor device 1 is connected to the liquid crystal panel 2 through the output outer leads 22 and to a circuit board 3 through the input outer leads 23. The semiconductor device 1, connected to the liquid crystal panel 2, exchanges signals and turns power on/off through the circuit board 3.

Now referring to the cross-sectional view in FIG. 6, the semiconductor device 1 contains a flexible substrate 11 and a liquid crystal driver chip (semiconductor chip) 15 packaged on the flexible substrate 11. The flexible substrate 11 contains a flexible insulating base member 11a and Cu wires 12 on the member 11a. The member 11a is, for example, a polyimide film and is 40 µm thick. The wires 12 are, for example, copper and 12 µm thick. The Cu wires 12 is provided by depositing a thin film of metal on the base substrate by sputtering and patterning the film by electroplating and etching.

The Cu wires 12, except those portions needed to form electrical connections, are covered with a polyimide solder resist 14 (shaded in the figure) to provide protection from surroundings. In FIG. 1, the semiconductor device 1 is illustrated as it is viewed in the direction indicated by the arrow in FIG. 6, that is, from the base member 11a. The solder resist 14, the liquid crystal driver chip 15, and the wires are illustrated with the base member 11a being transparent so as to visualize how the Cu wires 12 are routed. This is the same with FIG. 2 (detailed later) where the solder resist 14, the liquid crystal driver chip 15, and the wires are illustrated with the base member 11a being transparent.

Those portions of the Cu wires 12 which are needed to form electrical connections are the output outer leads 22 and input outer leads 23 as external contact terminals, and inner leads 24 used to form electrical connections to the liquid crystal driver chip 15 packaged on the flexible substrate 11.

The inner leads 24, output outer leads 22, and input outer leads 23 are coated with Sn (not shown) on their surfaces by electroless plating. However, it is only the inner leads 24 that need the Sn coating on the surface. The Sn coatings on the output outer leads 22 and input outer leads 23 are formed in the same Sn plating process as the inner leads 24, but are not intended for any particular electrical or mechanical purposes.

The liquid crystal driver chip 15 has projecting electrodes 40 on output terminals 28 and input terminals 29 as shown in FIG. 6. The electrodes 40 are, for example, 10 μm high and made of silver by plating, and serve to establish connections to the inner leads 24. The output terminals 28 and input terminals 29 appear to overlap the inner leads 24 in FIGS. 1 and 2 because the figures are plan views.

Since Au and Sn form a eutectic Au—Sn alloy, the Au projecting electrodes 40 form an alloy with, and thus become connected to, the Sn on the surfaces of the inner leads 24. All the electrodes on the liquid crystal driver chip 15 are connected to the inner leads 24 of the flexible substrate 11 by this method for packaging on the flexible substrate 11.

The liquid crystal driver chip 15 and the flexible substrate 11 are connected to each other using a thermocompression device, for example. An exemplary set of conditions for the thermocompression is a temperature of 410° C., a pressure of 166713050 Pa ($210 \times 10^{-4}$ gf/um²), and a duration of 2 seconds. Needless to say, the tool support plane and the tool press plane of the pressure stage in the thermocompression device need be completely parallel to each other. If the two planes are not parallel, the flexible substrate 11 may tilt to the liquid crystal driver chip 15, possibly leading to connection failures and other defects.

The liquid crystal driver chip 15 has 384 output terminals 28, for example, to comply with a design where the liquid crystal panel 2 is of XGA (1024×768) resolution and the source signal lines of the liquid crystal panel 2 are driven by eight liquid crystal driver chips 15. XGA involves 1024×3 (R, G, B)=3072 source signal lines. To drive the panel 2 with the eight liquid crystal driver chip, each liquid crystal driver chip 15 drives 384 source signal lines. Apart from the 384 output terminals 28, each liquid crystal driver chip 15 has 45 input terminals 29. They are divided into 18 RSDS terminals for 3-bit inputs, 18 reference power source terminals, and 9 others including for power supply, grounding, clocks, etc.

In view of currently popular chip specifications, the liquid crystal driver chip 15 of this design would be a rectangle measuring 15 mm to 20 mm on a long side and have 420 or more terminals (inclusive of both input and output terminals), for example.

Attention should be paid to the layout of the output terminals 28 and input terminals 29 and the position of the liquid crystal driver chip 15. The output terminals 28 and input terminals 29 are lined along the four sides of the substantially rectangular liquid crystal driver chip 15. Besides, as shown in FIG. 1, most of the output terminals 28 which outnumber the input terminals 29 are lined along the two long opposing sides of the liquid crystal driver chip 15. The liquid crystal driver chip 15 is mounted to the flexible substrate 11 so that its length is perpendicular to the row of the output outer leads 22.

In the layout, wires 12a originating at the inner leads 24 connected to the output terminals 28 on the two long opposing sides of the liquid crystal driver chip 15 extend at first away from the liquid crystal driver chip 15 (perpendicular to the length of the liquid crystal driver chip 15) and then make a 90° change in direction before reaching the output outer leads 22. Therefore, in the semiconductor device 1 of the present embodiment, the wires make no travel around the liquid crystal driver chip 15 at all.

Meanwhile, there are more output terminals 28 provided along a short side of the liquid crystal driver chip 15 facing the output outer leads 22. Wires 12b originating at the inner leads 24 connected to these additional output terminals 28 extend linearly to the output outer leads 22.

On the remaining short side of the liquid crystal driver chip 15 facing the input outer leads 23 are provided the input terminals 29. Wires 12c originating at the inner leads 24 connected to the input terminals 29 extend linearly to the input outer leads 23.

Further, there are provided some more input terminals 29 on parts of the two long sides which are at right angles with this short side in a continuous manner from the short side. As with the output terminals, wires 12d originating at the inner leads 24 connected to the input terminals 29 on the two long opposing sides extend at first away from the liquid crystal driver chip 15 (perpendicular to the length of the liquid crystal driver chip 15) and then make a 90° change in direction before reaching the input outer leads 23. Therefore, the wires make no travel around the liquid crystal driver chip 15 at all.

As detailed above, in this arrangement, most of the output terminals 28 on the liquid crystal driver chip 15 are located on the two long sides nearest the row of output outer leads 22 perpendicular to the short sides. The wires 12a extending from the inner leads 24 connected to the output terminals 28 to the output outer leads 22 reach the output outer leads 22 without having to travel around the liquid crystal driver chip 15. The absence of wires skirting the liquid crystal driver chip 15 eliminates the need to secure space for the wires. Less space is needed for the wires 12a on the flexible substrate 11, which contributes to downscaling of the flexible substrate 11.

In addition, unlike the conventional arrangement where some output terminals are located on the long side for input for the downscaling purpose, the wires do not need to make as sharp a turn as 180°; the wires can be routed without making a sharper turn than about 90°. The wires are therefore shorter and have fewer curves where etching defects are likely, contributing to higher yield ratios.

Further, in the arrangement of the semiconductor device 1 of the present embodiment, some output terminals 28 are provided on the short side of the liquid crystal driver chip 15 nearest the output outer leads 22. The wires 12b extend from the inner leads 24 connected to these output terminals 28 to the output outer leads 22. There are thus fewer output terminals on the two long sides perpendicular to the short sides, allowing for downscaling of the long sides, hence of the semiconductor chip.

In the arrangement, the liquid crystal driver chip 15 is substantially rectangular and mounted so that its length at right angles with the row of output outer leads 22.

However, in the present invention, the liquid crystal driver chip 15 is not necessarily rectangular, and even if it is rectangular, may be placed differently from the embodiment for the following reasons. Since most of the output terminals 28 on the liquid crystal driver chip 15 are located on the two long sides nearest the row of output outer leads 22 perpendicular to the short sides, the wires 12a extending from the inner leads 24 connected to the output terminals 28 to the output outer leads 22 do not need to skirt the liquid crystal driver chip 15.

If a substantially rectangular liquid crystal driver chip is mounted so that its length is parallel to the row of output outer leads 22, the long side for input facing the row of input outer leads 23 is naturally elongated. This reduces by half the effects of the downscaling of the liquid crystal driver chip which are achieved by providing output terminals on the two opposing sides of the liquid crystal driver chip.

In contrast, as shown in FIG. 1, the liquid crystal driver chip 15 is substantially rectangular and mounted so that its length is perpendicular to the row of output outer leads 22; therefore, the effects of the downscaling of the liquid crystal driver chip 15 which are achieved by providing output terminals on the two opposing sides of the liquid crystal driver chip 15 are more effectively secured.

Now, move on to FIG. 2 illustrating the semiconductor device 1 still being mounted on a long and narrow tape carrier 10 before being individually punched off. The semiconductor device 1 is an individual product having been punched off the tape carrier 10 and subjected to every fabrication step. In this specification, the flexible substrate 11 is defined as part of the semiconductor device 1, as distinguished from the long and narrow tape carrier 10.

The tape carrier 10 has rows of sprocket holes 20 formed along its length. The direction in which the sprocket holes 20 are lined is the direction in which each work is processed in manufacturing equipment. The liquid crystal driver chip 15 is packaged on the tape carrier 10 so that its length is perpendicular to the row of the sprocket holes 20. The row of output outer leads 22 and the row of input outer leads 23 are arranged parallel to the row of sprocket holes 20 and perpendicular to the length of the liquid crystal driver chip 15.

The semiconductor device 1 mounted to the tape carrier 10 is punched out along an external shape line L1 (broken lines in the figure) by a punching machine or a mold to finally provide a liquid crystal driver as a product.

By forming the tape carrier 10 so that the length of the mounted liquid crystal driver chip 15 is perpendicular to the row of output outer leads 22 and also to the row of sprocket holes 20 in the above manner, an increased number of flexible substrates 11 can be obtained from the single tape carrier 10; the tape carrier is better utilized.

Figure 3:
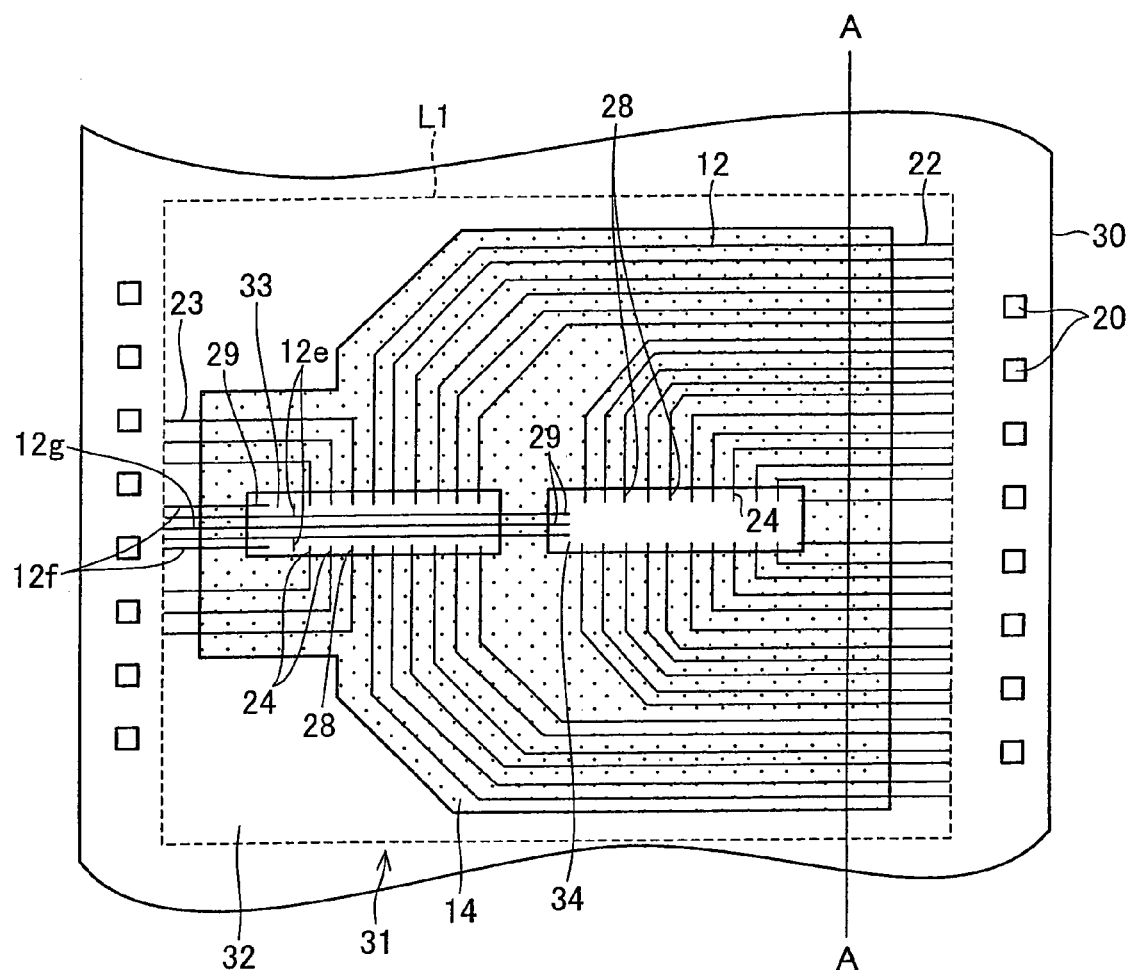
FIG. 3, showing another embodiment of the present invention, is a plan view illustrating a semiconductor device sitting on a tape carrier before being individually punched off.
Figure 4:
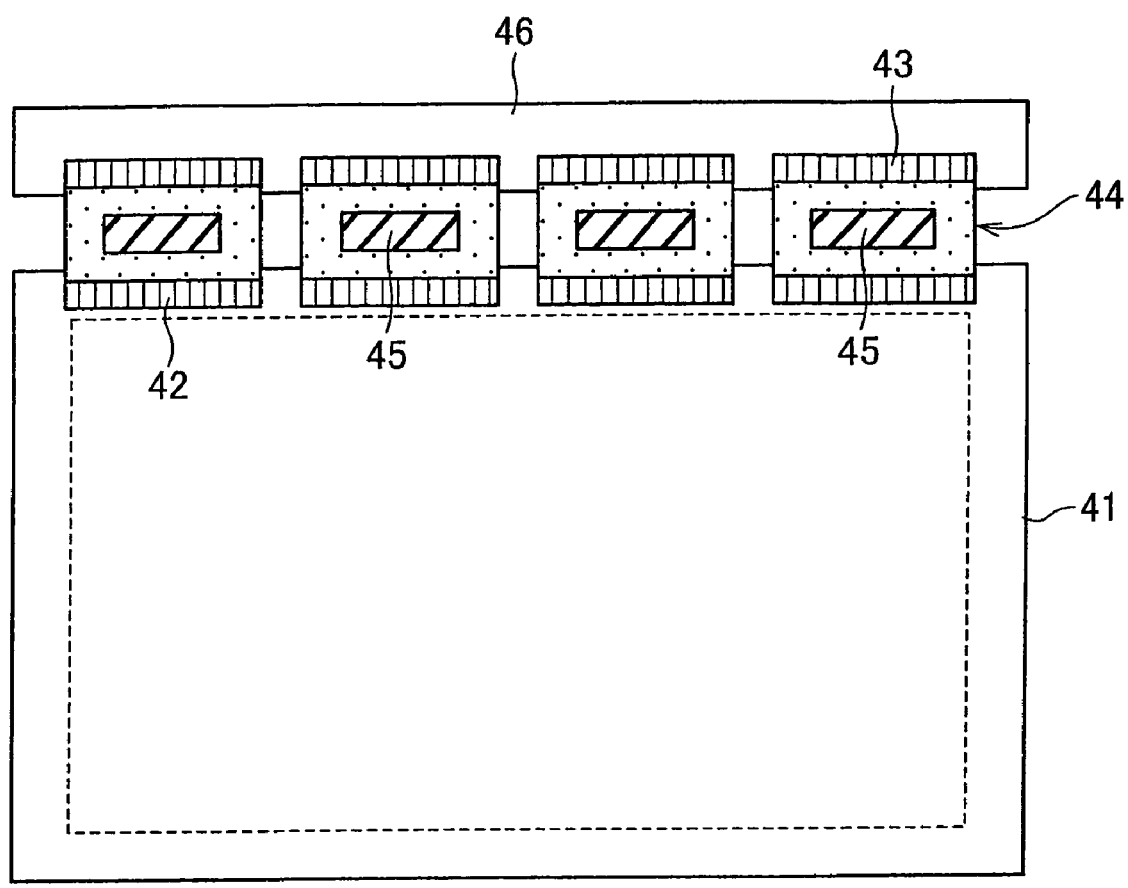
FIG. 4 is a plan view of a conventional liquid crystal panel module.
Figure 5:
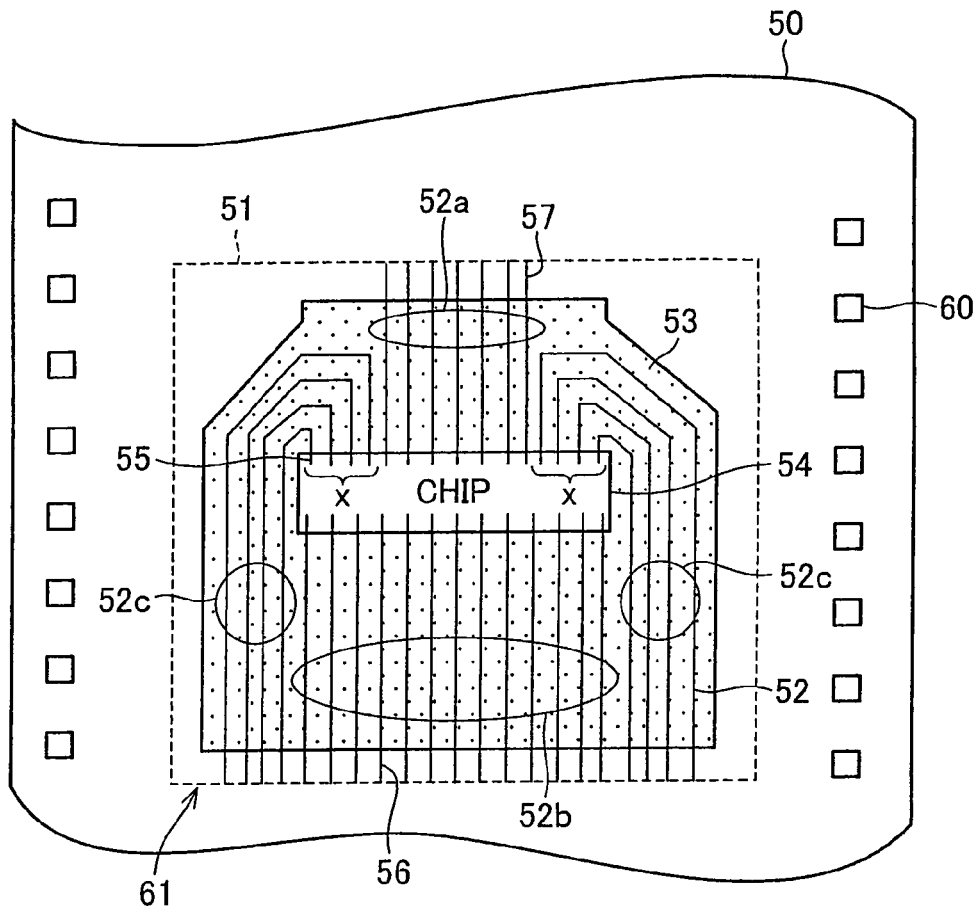
FIG. 5 is a plan view illustrating the conventional semiconductor device sitting on a tape carrier before being individually punched off.

Now, referring to FIG. 3, the following will describe another embodiment in accordance with the present invention. For convenience, members of the present embodiment that have the same arrangement and function as members of the foregoing embodiment, and that are mentioned in that embodiment are indicated by the same reference numerals and description thereof is omitted.

FIG. 3 is a plan view illustrating a COF semiconductor device 31 which is another embodiment in accordance with the present invention. In the figure, the device 31 is still mounted to the long and narrow tape carrier 30 before being individually punched off.

The semiconductor device 31 in FIG. 3 contains multiple liquid crystal driver chips (here, two chips: i.e., first and second liquid crystal driver chips 33, 34) on the same flexible substrate 32. The first and second liquid crystal driver chips 33, 34 are lined up so that their lengths are perpendicular to the row of output outer leads 22. The output terminals 28 and input terminals 29 are arranged on the first and second liquid crystal driver chips 33, 34 in the same manner as in embodiment 1. So are the wires extending from the inner leads 24 connected to the terminals 28, 29 to the output outer leads 22 and input outer leads 23. As were in FIGS. 1, 2, the solder resist 14, the liquid crystal driver chips 33, 34, and the wires are illustrated with the base member 11a being transparent so as to visualize how the Cu wires 12 are routed in FIG. 3 too.

The multiple liquid crystal driver chips 33, 34 mounted on one flexible substrate 32 in this manner give the semiconductor device 31 double the outputs of the aforementioned semiconductor device 1 if each liquid crystal driver chip 33, 34 has the same number of outputs (output terminals) as the aforementioned liquid crystal driver chip 15. Therefore, compared to an arrangement involving two semiconductor devices 1, the utilization ratio of the tape carrier is higher, the liquid crystal panel 2 has fewer contacts with the circuit board 3. Manufacturing cost is thus lowered.

In addition, in the semiconductor device 31 of the present embodiment, some of the wires extending from the inner leads 24 connected to the input terminals 29 on the two liquid crystal driver chips 33, 34 to the input outer leads 23 are shared by the first and second liquid crystal driver chips 33, 34. These common wires are shown as branch wires 12e in FIG. 3 and used, for example, for the transmission of power supply voltage and other signals that are common to the first and second liquid crystal driver chips 33, 34. Using the branch wires 12e to connect the first and second liquid crystal driver chips 33, 34 in parallel reduces the number of input outer leads 23 on the flexible substrate 32.

Signals that are not common to the first and second liquid crystal driver chips 33, 34, like video signals (RSDS), are fed to the first liquid crystal driver chip 33 directly via wires 12f connecting the input outer leads 23 to the inner leads 24 of the first liquid crystal driver chip 33 and to the second liquid crystal driver chip 34 via wires 12g connecting the input outer leads 23 to the inner leads 24 of the second liquid crystal driver chip 34. The wires 12g run under the first liquid crystal driver chip 33.

Packaging the multiple liquid crystal driver chips 33, 34 on one flexible substrate 32 gives an extra distance separating the row of input outer leads 23 from the row of output outer leads in the semiconductor device 31. It may be thought that this extra distance adds to the distance between the liquid crystal panel and the circuit board when the device 31 is placed between the liquid crystal panel and the circuit board. However, in actual use, the flexible substrate 32 is folded over the back surface of the liquid crystal panel along line A-A'. The packaging thus does not disrupt "frame size reduction" of the liquid crystal panel.

As described in the foregoing, the semiconductor device of the present invention is arranged as follows. The device contains at least one semiconductor chip packaged on a flexible substrate. The flexible substrate has input contact terminals and output contact terminals for external connection on two opposing sides and contact electrodes for electrical connection to the semiconductor chip. The semiconductor chip has output terminals on two sides perpendicular to one of four sides which is nearest the output contact terminals. The flexible substrate has wires extending thereon from the contact electrodes connected to the output terminals to the output contact terminals.

According to the structure, the semiconductor chip has output terminals on the two sides perpendicular to the side nearest the output contact terminals. The flexible substrate has wires extending thereon from the contact electrodes connected to the output terminals to the output contact terminals. The wires do not have to skirt the semiconductor chip. The wires can travel from the contact electrodes connected to the output terminals on the two sides to the output contact terminals.

The absence of wires skirting the semiconductor chip allows for shorter wire lengths and eliminates the need to secure space for the wires on the flexible substrate. This enables downscaling of the flexible substrate and efficient use of the tape carrier.

In addition, in the arrangement, the wires can be routed to the output contact terminals without making a sharper turn than about 90°. The wires thus have fewer curves where etching defects are likely, contributing to higher yield ratios.

The semiconductor device of the present invention may be further arranged as follows. The semiconductor chip has more output terminals on the side nearest the output contact terminals. The flexible substrate has more wires extending thereon from the contact electrodes connected to the output terminals to the output contact terminals.

The provision of more output terminals on the side nearest the output contact terminals on the semiconductor chip reduces the number of output terminals on the two sides perpendicular to that side. This allows for downscaling of the two sides, hence of the semiconductor chip. This in turn enables downscaling of the flexible substrate and efficient use of the tape carrier.

The semiconductor device of the present invention may be further arranged as follows. The semiconductor chip is substantially rectangular and is positioned so that its length is perpendicular to the row of the output contact terminals.

The substantially rectangular semiconductor chip could be mounted so that its length is parallel to the row of the output contact terminals. When this was actually the case, however, the long side for input facing the row of the input contact terminals on the semiconductor chip would be naturally elongated. This would reduce by half the effects of the downscaling of the semiconductor chip which are achieved by providing the output terminals on the two sides of the semiconductor chip. In contrast, by packaging the substantially rectangular semiconductor chip so that its length is perpendicular to the row of the output contact terminals, the effects of the downscaling of the semiconductor chip which are achieved by providing output terminals on the two sides of the semiconductor chip are more effectively secured.

The semiconductor device of the present invention may be further arranged as follows. The semiconductor chip has input terminals on one of the four sides thereof which is nearest the input contact terminals. The flexible substrate has more wires extending thereon from the contact electrodes connected to the input terminals to the input contact terminals.

Alternatively, the semiconductor device of the present invention may be further arranged as follows. The semiconductor chip has input terminals on the two sides perpendicular to one of the four sides which is nearest the input contact terminals. The flexible substrate has wires extending thereon from the contact electrodes connected to the input terminals to the input contact terminals.

The semiconductor device of the present invention may be further arranged as follows. A plurality of the semiconductor chip is lined up perpendicular to the row of the output contact terminals.

When, as in this case, a plurality of the semiconductor chip is lined up perpendicular to the row of the output contact terminals, it is preferable if the semiconductor chips commonly share some of the wires extending from the contact electrodes connected to the input terminals on the semiconductor chips to the input contact terminals.

According to the arrangement, if the commonly shared wires are utilized for the transmission of power supply voltage and other signals that are common to the semiconductor chips, the flexible substrate needs fewer input contact terminals.

The flexible substrate of the present invention is arranged as follows. The flexible has at least one semiconductor chip packaged thereon. The substrate includes: input contact terminals and output contact terminals on two opposing sides; and contact electrodes for electrical connection to the semiconductor chip. The contact electrodes are arranged in a manner corresponding to the four sides of the semiconductor chip. The wires extending from those of the contact electrodes which are provided on the two sides perpendicular to one of the four sides nearest the output contact terminals are connected to the output contact terminals.

As explained in relation to the semiconductor device, mounting a semiconductor chip on a flexible substrate arranged as above enables downscaling of the flexible substrate and efficient use of the tape carrier, contributing to high yields.

The flexible substrate of the present invention may be further arranged as follows. The semiconductor chip is substantially rectangular. The contact electrodes arranged in a manner corresponding to the four sides of the semiconductor chip are positioned so that the length of the semiconductor chip is perpendicular to the row of the output contact terminals.

As explained in relation to the semiconductor device, mounting a semiconductor chip on a flexible substrate arranged as above better enables downscaling of the flexible substrate and efficient use of the tape carrier, contributing to high yields.

The tape carrier of the present invention, as described in the foregoing, is arranged as follows. The tape carrier includes a long and narrow base member and a row of sprockets on the sides thereof along the length of the base member. The tape carrier is divided along the external shape of each semiconductor device so as to form input contact terminals and output contact terminals on two opposing sides and to provide multiple flexible substrates having contact electrodes for electrical connection to a semiconductor chip. The contact electrodes are arranged in a manner corresponding to the four sides of the semiconductor chip. The wires extending from the contact electrodes provided on two sides perpendicular to one of the four sides nearest the output contact terminals are connected to the output contact terminals.

As explained in relation to the semiconductor device, mounting a semiconductor chip on a flexible substrate obtained from a tape carrier arranged as above enables downscaling of the flexible substrate and efficient use of the tape carrier, contributing to high yields.

The tape carrier of the present invention may be further arranged as follows. The semiconductor chip is substantially rectangular. The contact electrodes arranged in a manner corresponding to the four sides of the semiconductor chip are positioned so that the length of the semiconductor chip is perpendicular to the row of the output contact terminals.

As explained in relation to the semiconductor device, mounting a semiconductor chip on a flexible substrate obtained from a tape carrier arranged as above better enables downscaling of the flexible substrate and efficient use of the tape carrier.

The tape carrier of the present invention may be further arranged as follows. The semiconductor chip is substantially rectangular. The contact electrodes arranged in a manner corresponding to the four sides of the semiconductor chip are positioned so that the length of the semiconductor chip is perpendicular to the row of the output contact terminals and also to the row of the sprocket holes in the tape carrier.

By forming the tape carrier so that the length of the substantially rectangular semiconductor chip is perpendicular to the row of the output contact terminals and also to the row of the sprocket holes in the tape carrier, an increased number of flexible substrates can be obtained from the single tape carrier; the tape carrier is better utilized.

The electronic device of the present invention is, as described in the foregoing, characterized in that it includes the semiconductor device of the present invention.

The semiconductor device of the present invention, as already explained, enables downscaling of the flexible substrate and efficient use of the tape carrier and contributes to high yields. The inclusion of the semiconductor device allows for less expensive electronic devices.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A flexible substrate on which a plurality of semiconductor chips are packaged, said flexible substrate comprising:

input contact terminals and output contact terminals for external connection on two opposing sides;

contact electrodes for electrical connection to each of the semiconductor chips, the electrodes being arranged in a manner corresponding to four sides of the semiconductor chip; and wires extending from those of the contact electrodes which are provided on two sides perpendicular to one of four sides nearest the output contact terminals, the wires being connected to the output contact terminals.

2. The flexible substrate of claim 1, wherein:

the semiconductor chip is substantially rectangular; and the contact electrodes arranged in a manner corresponding to four sides of the semiconductor chip are positioned so that a length of the semiconductor chip is perpendicular to a row of the output contact terminals.

3. A tape carrier including a long and narrow base member and a row of sprocket holes on sides thereof along a length of the base member, said tape carrier being divided along external shape of each semiconductor device so as to form input contact terminals and output contact terminals for external connection on two opposing sides and to provide multiple flexible substrates having contact electrodes for electrical connection to at least one semiconductor chip, the semiconductor chip being substantially rectangular and having an aspect ratio of less than one-fifth, the contact electrodes being arranged in a manner corresponding to four sides of the semiconductor chip, wires extending from the contact electrodes provided on two sides perpendicular to one of the four sides nearest the output contact terminals, the wires being connected to the output contact terminals.

4. The tape carrier of claim 3, wherein:

the contact electrodes arranged in a manner corresponding to four sides of the semiconductor chip are positioned so that a length of the semiconductor chip is perpendicular to the row of the output contact terminals.

5. The tape carrier of claim 3, wherein:

the contact electrodes arranged in a manner corresponding to four sides of the semiconductor chip are positioned so that a length of the semiconductor chip is perpendicular to the row of the output contact terminals and also to the row of the sprocket holes in the tape carrier.

6. A semiconductor device, comprising:

a plurality of semiconductor chips; and a flexible substrate on which the semiconductor chips are packaged, the substrate having input contact terminals and output contact terminals for external connection on two opposing sides and contact terminals for electrical connection to the semiconductor chips, each of the semiconductor chips being substantially rectangular and having output terminals on two long sides thereof so that the two long sides are perpendicular to a row of the output contact terminals, and the flexible substrate having wires extending thereon from the contact electrodes connected to the output terminals to the output contact terminals.

7. An electronic device, comprising a semiconductor device including:

a plurality of semiconductor chips; and a flexible substrate on which each of the semiconductor chips is packaged, the substrate having input contact terminals and output contact terminals for external connection on two opposing sides and contact electrodes for electrical connection to the semiconductor chips, each of the semiconductor chips being substantially rectangular and having output terminals on two long sides thereof so that the two long sides are perpendicular to a row of the output contact terminals, and the flexible substrate having wires extending thereon from the contact electrodes connected to the output terminals to the output contact terminals.

* * * * *